United States Patent
Maclean et al.

(10) Patent No.: US 7,064,607 B2
(45) Date of Patent: Jun. 20, 2006

(54) BIAS SYSTEM AND METHOD

(75) Inventors: Kenneth George Maclean, Dallas, TX (US); Suribhotla Venkata Rajasekhar, Plano, TX (US); David John Baldwin, Allen, TX (US); Marco Corsi, Parker, TX (US); Tobin Hagan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 200 days.

(21) Appl. No.: 10/748,986

(22) Filed: Dec. 29, 2003

(65) Prior Publication Data

US 2005/0140437 A1   Jun. 30, 2005

(51) Int. Cl.
*H03G 3/20* (2006.01)
(52) U.S. Cl. .................. 330/136; 330/255; 330/261
(58) Field of Classification Search ............. 330/136, 330/255, 261
See application file for complete search history.

(56) References Cited

U.S. PATENT DOCUMENTS

| | | | |
|---|---|---|---|
| 5,907,263 A * | 5/1999 | Divine et al. ............... 331/16 |
| 6,100,762 A * | 8/2000 | Kato .......................... 330/255 |
| 6,157,263 A | 12/2000 | Lee et al. |
| 6,262,616 B1 * | 7/2001 | Srinivasan et al. ......... 327/264 |
| 6,323,695 B1 * | 11/2001 | Heinrich ..................... 327/89 |
| 6,501,334 B1 * | 12/2002 | Corsi et al. ................. 330/267 |
| 6,535,066 B1 | 3/2003 | Petsko |
| 6,542,032 B1 | 4/2003 | Escobar-Bowser et al. |
| 2003/0112073 A1 * | 6/2003 | Luo et al. ................... 330/285 |

* cited by examiner

*Primary Examiner*—Patricia Nguyen
(74) *Attorney, Agent, or Firm*—William B Kempler; W. James Brady, III; Frederick J. Telecky, Jr.

(57) ABSTRACT

A bias device that modifies the bias of a device based on an input signal to the device. The device may have a fixed bias, and the bias device can be connected in parallel with the fixed bias. The device can be an amplifier, such as a linear amplifier or a class AB amplifier. The bias device can be configured to provide maximum bias during the device's crossover time period.

17 Claims, 5 Drawing Sheets

BIAS SYSTEM AND METHOD

TECHNICAL FIELD

The present invention is directed to biasing devices, and more particularly to a system and method for providing additional bias to a circuit during a predetermined time period.

BACKGROUND OF THE INVENTION

An ideal amplifier exhibits a linear transfer characteristic. For real amplifiers, biasing is a technique used to achieve linear operation. This can be achieved by biasing the circuit by applying a direct current (DC) voltage or current to select an operating point, or the quiescent point. The signal to be amplified is then superimposed on the DC bias. The bias point should be set high enough so that the amplifier does not enter a cut-off state while amplifying the signal, and yet low enough so that the amplifier does not saturate.

Crossover distortion occurs in circuits that use devices operating in a "push-pull" manner. The devices are used in pairs and each device operates for only a half cycle of the input signal (e.g., class AB operation). However, if the circuit is not designed to achieve a smooth crossover or transition from one device to another, then there can be a non-linear region of the transfer characteristics (e.g., when the output has a zero amplitude for a non-zero input). The biasing of each device can determine the amount of time that the device operates over the input signal's time period.

SUMMARY OF THE INVENTION

The present invention is directed to a bias device for a device that provides an output signal based on an input signal. The bias device provides a boost to the bias of the device based on the input signal. The device may have a fixed bias, and the bias device can be connected in parallel with the fixed bias. The device can be an amplifier, such as a linear amplifier or a class AB amplifier. The bias device can be configured to provide maximum bias during the device's crossover time period.

In accordance with another aspect of the present invention, the bias boost can be phase shifted based on the input signal. The bias boost from the bias device can be shifted substantially ninety degrees from the input signal. The modified bias can be a full-wave rectified current signal.

Another aspect of the present invention is a method comprising monitoring an input signal, and modifying an amplifier bias based on the monitored input signal to provide a boost during a predetermined time period. The input signal can be amplified employing the modified bias. The boost to the bias can be turned on in the presence of an input signal, and can be discontinued after no input signal has been detected. The boost can be phase shifted from the input signal, for example the bias can be phase shifted by ninety degrees based on the input signal. Furthermore, the method can provide the maximum bias during the amplifier's crossover period.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates to systems and methods that boost the bias of a device based on an input signal to the device. The boost can be provided at and/or near zero crossing amplitudes or at another predetermined input signal amplitude range. The device may have a fixed bias, and the bias device can be connected in parallel with the fixed bias. Additionally, the bias boost can be phase shifted based on the input signal. The bias signal from the bias device can be shifted substantially ninety degrees from the input signal. The bias boost can be provided as a full-wave rectified current signal.

Figure 1:
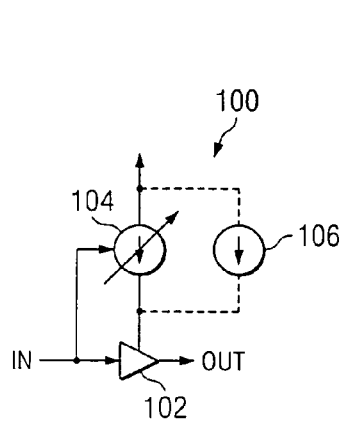
FIG. 1 is a schematic diagram of an amplifier circuit with a variable bias in accordance with an aspect of the present invention.

Referring to FIG. 1, there is illustrated a system 100 in accordance with an aspect of the present invention. The system 100 comprises a device 102 that provides an output signal (OUT) based on an input signal (IN). The device 102 has an associated bias device 104. Bias device 104 comprises a variable current source that modifies the bias to device 102 based on the input signal.

The variable current source can have a first setting for amplifying a signal and a second setting for a quiescent state. Alternatively, the variable current source can be dynamically adjusted to correspond to the input signal's amplitude. For example, for a sine wave input the variable current source can provide maximum current at the zero crossover region and minimal current at the peaks of the sine wave.

As illustrated in FIG. 1, the device 102 is an amplifier. The amplifier can be a linear amplifier, such as for example a class AB amplifier. However, device 102 can be any device that can be biased, such as for example a semiconductor device (e.g., a transistor), a multi-component element or a vacuum tube.

The device 102 can also have a fixed bias 106. As shown in FIG. 1, the fixed bias 106 is a current source connected in parallel to bias device 104. When the bias being provided is voltage instead of current, then fixed bias 106 and bias device 104 can be connected in series instead of in parallel.

For device's that have a crossover time period (e.g., a class AB amplifier), bias device 104 can be configured to provide maximum bias during the device's crossover time period. Bias device 104 can modify the bias by phase shifting the bias based on the input signal. For example, the bias device 104 can track the input signal and provide the maximum bias when the input signal is at and/or near a zero crossing amplitude by shifting the bias about ninety degrees (or any bias shift that reduces or eliminates crossover distortion). Bias device 104 can provide a full wave rectified bias signal that can be synchronized or phase shifted to provide the desired signal. Alternatively, the bias device can provide a fixed bias.

Bias device 104 can be turned off in the absence of an input signal. For example, if bias device 104 is tracking the input signal, then in the absence of an input signal, bias device 104 would not provide a bias. Control logic (not shown) can also be used to turn off bias device 104 when device 102 is idle.

Figure 2:
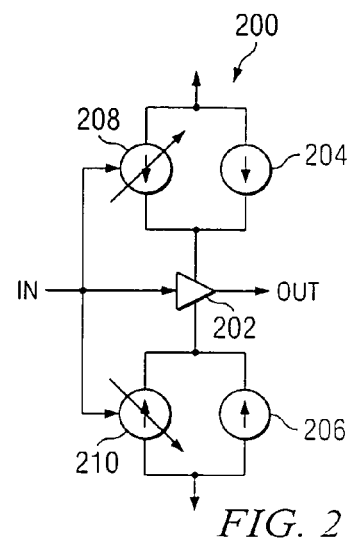
FIG. 2 is a schematic diagram of a variable bias circuit that can be used with a class AB amplifier.

Referring to FIG. 2, there is shown a system 200 in accordance with an aspect of the present invention. The system 200 comprises a device 202 (e.g., an amplifier) that provides an output signal (OUT) based on an input signal (IN). The device 202 has associated bias devices 204, 206, 208 and 210. Bias devices 204 and 206 provide a fixed bias. Bias devices 208 and 210 modify the bias provided by devices 204 and 206 by providing a variable bias to device 202 based on the input signal. The current provided by bias device 204 can be equal to the current provided by bias device 206. Similarly, the current provided by variable bias device 208 can be the same as the current provided by variable bias device 210.

As shown in FIG. 2, the device 202 is an amplifier. The amplifier can be a linear amplifier, such as for example a class AB amplifier. However, device 202 can be any device that can be biased, such as for example a semiconductor (e.g., a transistor or FET) or a vacuum tube.

Because device 202 is current biased, the variable bias devices 208 and 210 are connected in parallel to the fixed bias devices 204 and 206, respectively. However, if the bias being provided is voltage instead of current, then the variable bias devices 208 and 210 may be connected in series to fixed bias devices 204 and 206, respectively.

For device's that have a crossover time period (e.g., a class AB amplifier), bias devices 208 and 210 can be configured to provide maximum bias during the device's crossover time period. Bias devices 208 and 210 can modify the bias by phase shifting the bias based on the input signal. For example, the bias devices 208 and 210 can track the input signal and provide the maximum bias when the input signal is crossing at or near a zero amplitude point by shifting the bias ninety degrees (or any bias shift that reduces or eliminates crossover distortion). Bias device 210 can provide a full wave rectified bias signal that can be synchronized or phase shifted to provide the desired signal, or can provide an additional fixed bias.

Bias devices 208 and 210 can be turned off in the absence of an input signal. For example, if bias devices 208 and 210 are tracking the input signal, then in the absence of an input signal, bias devices 208 and 210 would not provide a bias. This will allow the amplifier to remain in a quiescent state and reduce power consumption. Control logic (not shown) can also be used to turn off bias device 104 when device 102 is idle.

Figure 3:
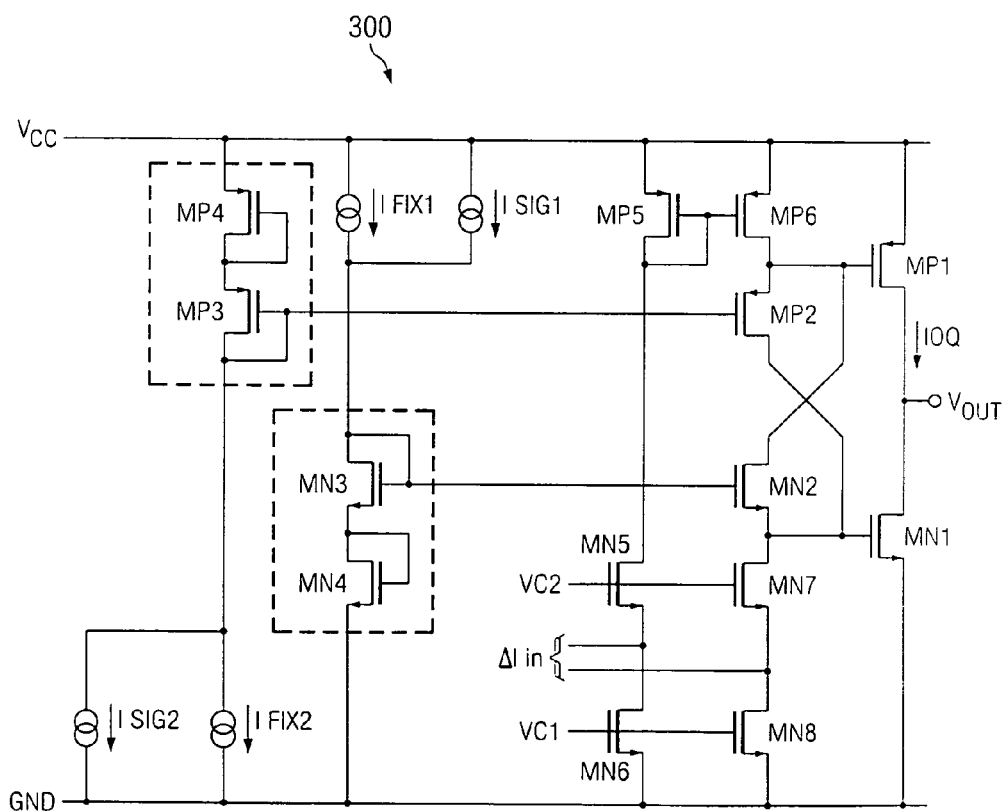
FIG. 3 is an example of a class AB output stage employing a bias device in accordance with an aspect of the present invention.

Referring now to FIG. 3, there is illustrated an output stage of a class AB amplifier 300. An input signal ΔIin causes transistors MN5, MN6, MN7, MN8, MP5 and MP6 to drive transistors MP1 and MN1. Voltage bias signal VC1 bias transistors MN6 and MN8 and voltage bias signal VC2 bias transistors MN5 and MN7. Transistors MP2 and MN2 control transistors MP1 and MN1 from where the output current IOQ flows. MP1 and MN1 are each turned on for approximately a half cycle so that the current flows through the load (not shown) connected at VOUT. The current through MP1 is set by transistors MP2, MP3 and MP4. MP3 and MP4 are biased by fixed current source IFIX2. The current through MN1 is set by transistors MN2, MN3 and MN4. MN3 and MN4 are biased by fixed current source IFIX1. To increase the output current IOQ, signal dependent current sources ISIG1 and ISIG2 are added in parallel to IFIX1 and IFIX2 respectively. Signal dependent current sources ISIG1 and ISIG2 can be set to add (boost) current during the entire duty cycle of ΔIin or for a portion of the duty cycle (e.g., at or near zero crossings).

Figure 4:
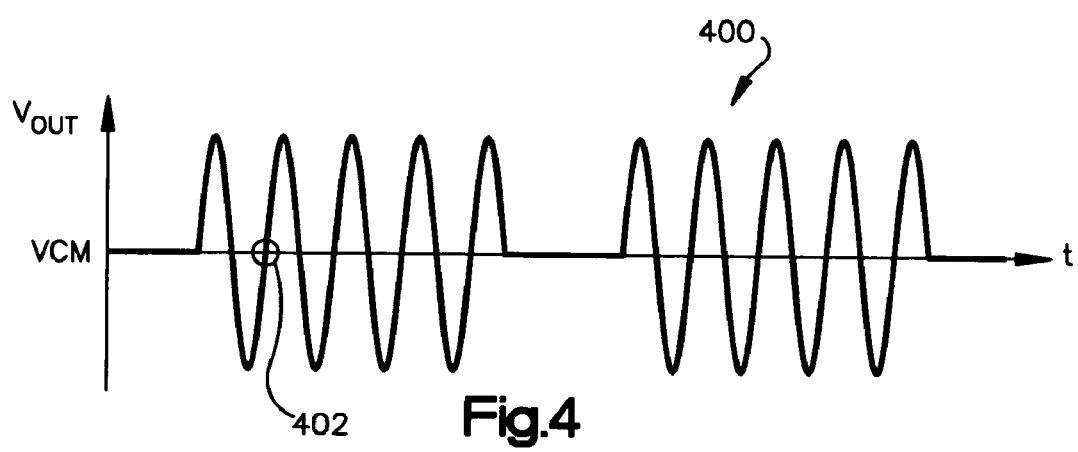
FIG. 4 is a graphical illustration of an input signal.
Figure 5:
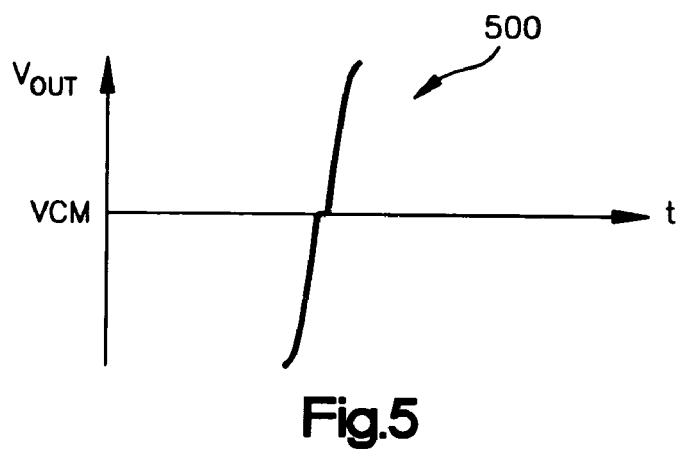
FIG. 5 is a graphical illustration of crossover distortion.

FIG. 4 illustrates a graphical example input signal 400. The signal uses on-off keying and has a sine wave bursts, representing a binary one, and gaps representing binary zero. FIG. 4 illustrates a region 402 where the sine wave burst crosses a zero amplitude region. FIG. 5 is an example of crossover distortion 500 that can occur when the input signal is in the zero amplitude region 402. Crossover is caused due to the output FETs (e.g., MP1 and/or MN1 in FIG. 3) current being minimized during a zero crossing and output impedance (ZOUT) being maximized. If ZOUT is significant with respect to the load impedance (ZLOAD), then crossover distortion occurs. Crossover distortion can be alleviated by adding additional bias current (ISIG1 and/or ISIG2) at or near the zero amplitude regions of the input signal.

Figure 6:
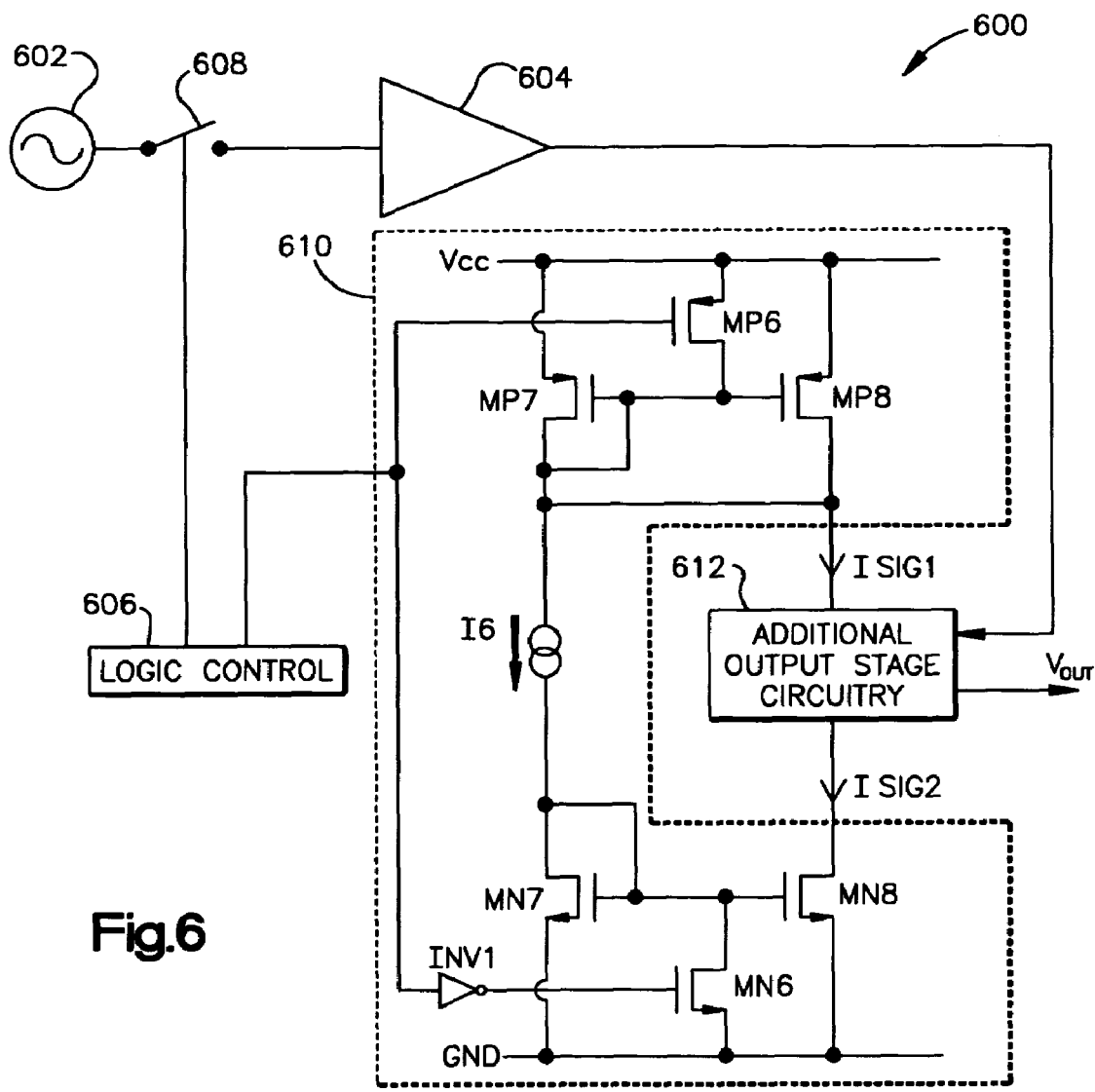
FIG. 6 is a schematic diagram of a system with bias device in accordance with an aspect of the present invention.

FIG. 6 is a schematic illustration of a system 600 in accordance with an aspect of the present invention. The system 600 has an input signal 602. Input signal 602 is amplified by an input stage 604 before being sent to output stage 612. Output stage 612 comprises additional output circuitry. Logic control 606 detects when an output signal 602 is required and closes switch 608 to provide the input signal 602 to input stage 604 and to activate bias device 610. A control signal is fed to MP6, and the inverted control signal is fed via inverter INV1 to MN6. When MP6 and MN6 turn off, then current from current source 16 flows through MP7 and MN7, which are coupled to MP8 and MN8 in a current mirror configuration, causing currents ISIG1 and ISIG2 to flow through MP8 and MN8 respectively. When logic controller 606 turns MP6 and MN6 on, current flows through MP6 and MN6, and turns off MP8 and MN8, shutting off currents ISIG1 and ISIG2. The current boost provided by the system 600 depends on the presence of an input signal, and not the amplitude or phase of the input signal. If desired, bias device 610 can be suitably adapted to only provide ISIG1 and ISIG2 during a portion of the input signal's duty cycle, or provide ISIG1 and ISIG2 during the entire duty cycle.

Figure 7:
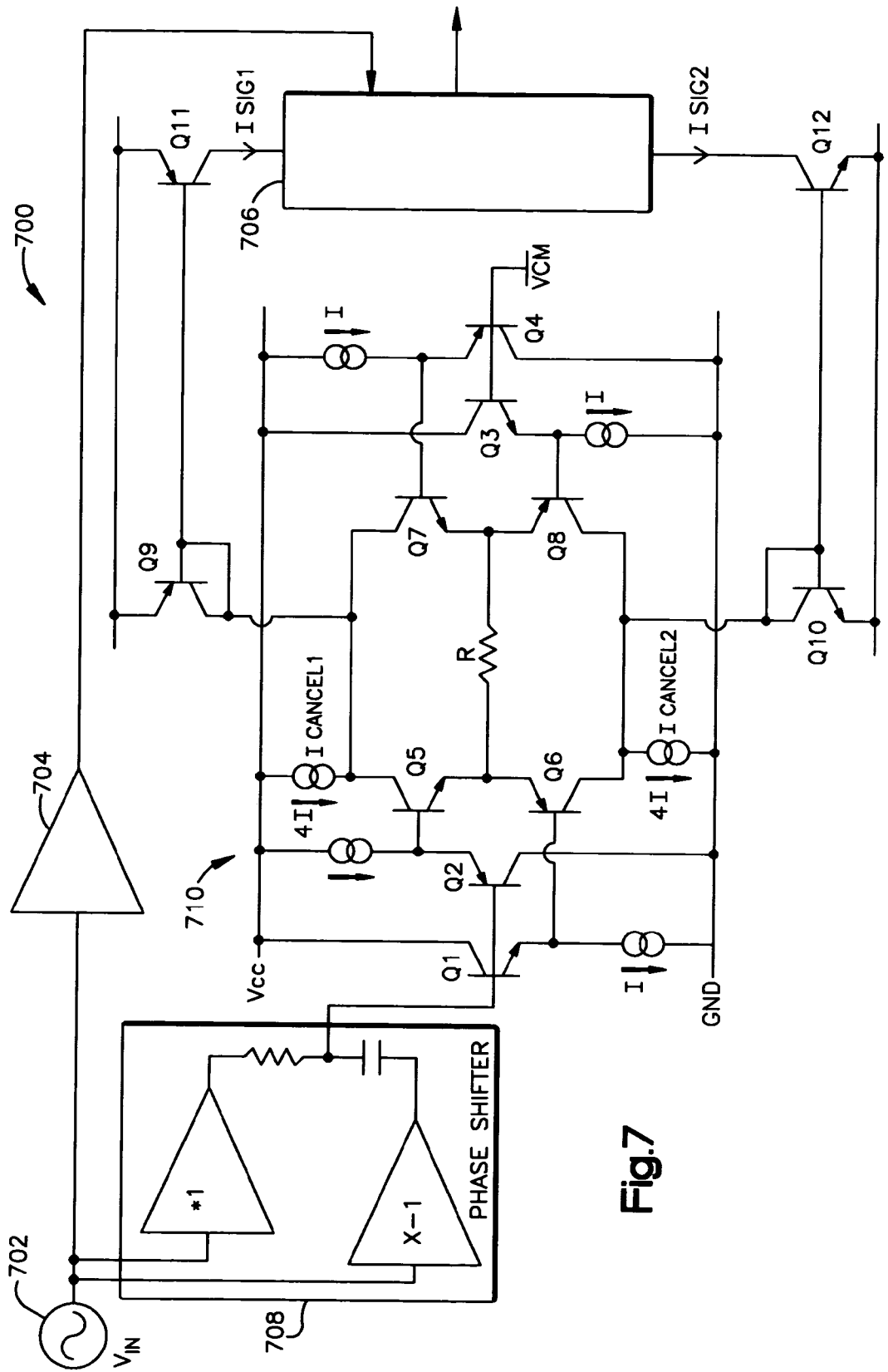
FIG. 7 is a schematic diagram of a system with a bias device used to generate a boost current in accordance with an aspect of the present invention.

FIG. 7 is a schematic illustration of a system 700 with a bias device in accordance with another aspect of the present invention. An input signal 702 is fed into an input stage amplifier 704, and then to an output stage 706 that comprises additional amplification circuitry. Input signal 702 is also fed to the bias device. The bias device modifies the bias current to output stage 706 based on the input current. The bias device comprises a phase shifter 708 and a transconductance loop 710.

Phase shifter 708 amplitude scales and phase shifts input signal 702. The phase can be shifted by ninety degrees or any desired phase angle in order to provide a current boost at a desired time within the duty cycle or the input signal. The phase shifted and amplitude adjusted input signal is then input into the transconductance loop 710. Transistors Q1, Q2, Q3 and Q4 are buffer transistors and control the current flow through transistors Q5, Q6, Q7 and Q8. Current flows through resistor R as a function of VIN, and is proportional to (VIN−VCM)/R. Thus, selecting R can be used to select the amount of boost current. VCM can be a static voltage, which would make all the current flowing through R dependent on VIN. When current flows through R, this causes current to flow through transistors Q9 and Q10 which are current mirrors for transistors Q11 and Q12 respectively. Output currents ISIG1 is obtained from Q11 and output current ISIG2 is obtained from Q12. Current sources ICANCEL1 and ICANCEL2 can be used to compensate for, or remove, the quiescent (fixed) bias from ISIG1 and ISIG2.

Figure 8:
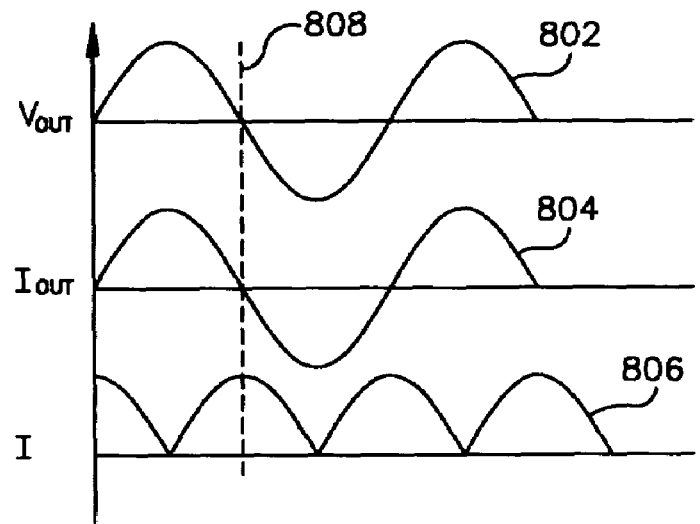
FIG. 8 is a graphical illustration comparing the output voltage and current to the current supplied by a bias device for a purely resistive load in accordance with an aspect of the present invention.

FIG. 8 is a graphical illustration comparing the output voltage and current to the current supplied by a bias device for a purely resistive load of system 700. The output voltage VOUT 802 and the output current IOUT 804 are in phase. IBOOST 806 illustrates the current provided from transconductance loop 708. The current, IBOOST, is a full-wave rectified signal that is ninety degrees out of phase with VOUT 802 and IOUT 804, thus providing maximum current boost at the zero crossings of VOUT 802 and IOUT 804, and minimal or no current boost when VOUT 802 and IOUT 804 are at their peaks. Dashed line 808 illustrates that IBOOST 806 peaks when VOUT 802 and IOUT 804 are at a zero crossing. For loads where VOUT 802 and IOUT are not in phase, phase shifter 708 can be adjusted to provide the maximum current boost at the desired time.

Figure 9:
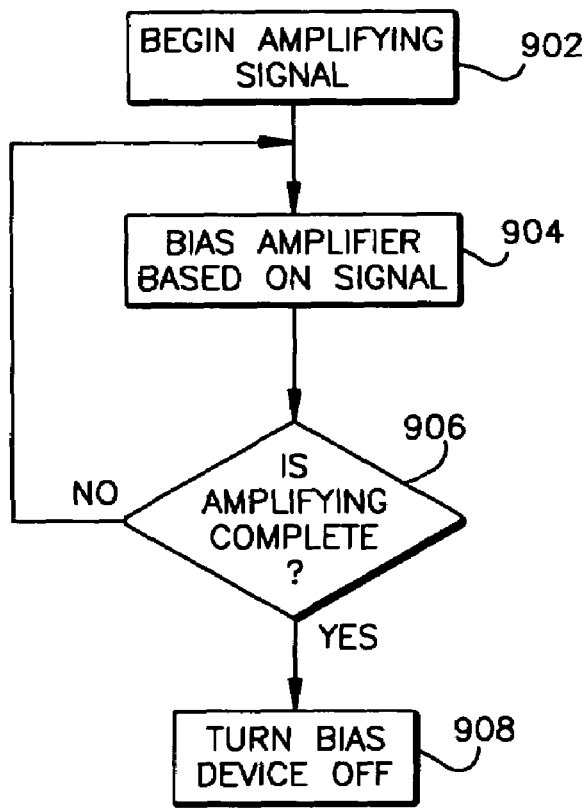
FIG. 9 is an example methodology in accordance with an aspect of the present invention.

Referring now to FIG. 9, there is illustrated a methodology 900 in accordance with an aspect of the present invention. While, for purposes of simplicity of explanation, the methodology 900 is shown and described as executing serially, it is to be understood and appreciated that the present invention is not limited by the order shown, as some aspects may, in accordance with the present invention, can occur in different orders and/or concurrently from that shown and described herein. Moreover, not all features shown or described may be needed to implement a methodology in accordance with the present invention. Although the methodology 900 is described in the context of an amplifier, those skilled in the art can readily appreciate that the methodology is equally applicable to other devices that are biased, including but not limited to semiconductors (e.g., transistors), multi-component circuits and vacuum tubes.

At 902, an amplifier begins amplifying an input signal. A device may be coupled to the input of the amplifier to monitor the input and determine when an input signal is being received. At 904, the amplifier bias is modified based on the input signal. The bias may be modified by providing a fixed bias source and a variable bias source. The fixed bias source provides a static bias, while the variable bias boosts the bias by providing an additional bias to the circuit based on the monitoring of the input signal. The bias signal can track the input signal and if desired provide a bias signal that is phase shifted in relation to the input signal. For example, the amplifier bias can be modified in order to provide maximum bias (e.g., a current boost) during the amplifier's crossover time period. The modified amplifier bias can compensate for a quiescent (fixed) bias that is provided to the amplifier. At 906, it is determined whether amplifying is complete. This can be done by monitoring the input signal. For example, the absence of an input signal would be indicative of amplifying being complete. If the amplifier is controlled by a logic device (e.g., a power save controller), then the bias device can be turned off when the amplifier is turned off. If amplification is not complete (NO), then the method 900 returns to 904. If amplification is complete at 906 (YES), then as shown at 908, the bias device can be turned off.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system, comprising:
a device that provides an output signal based on an input signal, the device having an associated bias; and
a bias device that provides a boost to the bias of the device based on the input signal;
wherein the bias device is further configured to provide maximum bias during the device's crossover time period.

2. The system of claim 1, further comprising a fixed biased device associated with the device, the bias device is connected in parallel to the fixed bias device.

3. The system of claim 1, the device is an amplifier.

4. The system of claim 3, the amplifier is a class AB amplifier.

5. The system of claim 1, the bias device modifies a bias current associated with the device.

6. A system, comprising:
a device that provides an output signal based on an input signal, the device having an associated bias; and
a bias device that provides a boost to the bias of the device based on the input signal;
the bias device is further configured to provide maximum bias during the device's crossover time period;
wherein, the bias device further comprising a phase shifter that phase shifts the bias based on the input signal.

7. The system of claim 6, the phase shifter phase shifts the boost substantially ninety degrees from the input signal.

8. The system of claim 1, the bias device comprises a full-wave rectifier that provides a full-wave rectified current signal.

9. The system of claim 8, the bias device further comprises a phase shifter, the full-wave rectified current signal is phase shifted based on the input signal.

10. The system of claim 1, the bias device turning off during an absence of the input signal, and turning on during the presence of an input signal.

11. A system comprising:
means for providing a boost to a bias signal to a biased circuit; and
means for controlling the means for providing a boost, based on an input signal;
further comprising means for phase shifting the bias signal based on the input signal, the means for phase shifting configured to produce a maximum bias at a zero amplitude region.

12. The system of claim 11, further comprising means for providing a fixed bias associated with the biased circuit, the means for providing a fixed bias being in parallel with the means for producing a bias signal.

13. The system of claim 11, the means for controlling further comprising means for turning off the means for providing a boost in the absence of an input signal and for turning on the means for providing a boost in the presence of an input signal.

14. A method, comprising:
monitoring an input signal; and
modifying an amplifier bias based on the monitored input signal to provide a boost at a predetermined time;
further comprising phase shifting the amplifier bias based on the signal being amplified.

15. The method of claim 14, further comprising amplifying the input signal employing the modified bias.

16. The method of claim 14, the modifying further comprising enabling a boost in the presence of an input signal and discontinuing the boost after no input signal has been detected.

17. The method of claim 15, further comprising providing the maximum boost during the amplifier's crossover period.

* * * * *